(12) United States Patent
Elaasar et al.

(10) Patent No.: US 12,671,457 B2
(45) Date of Patent: *Jun. 30, 2026

(54) LOCAL OSCILLATOR DRIVER CIRCUITRY WITH SECOND HARMONIC REJECTION

(71) Applicant: Apple Inc., Cupertino, CA (US)

(72) Inventors: Omar E Elaasar, San Diego, CA (US); Aly Ismail, San Diego, CA (US)

(73) Assignee: Apple Inc., Cupertino, CA (US)

( * ) Notice: Subject to any disclaimer, the term of this patent is extended or adjusted under 35 U.S.C. 154(b) by 177 days.

This patent is subject to a terminal disclaimer.

(21) Appl. No.: 18/742,280

(22) Filed: Jun. 13, 2024

(65) Prior Publication Data

US 2024/0333333 A1 Oct. 3, 2024

Related U.S. Application Data

(63) Continuation of application No. 17/877,503, filed on Jul. 29, 2022, now Pat. No. 12,052,048.

(51) Int. Cl.
*H04B 1/403* (2015.01)
*H03D 7/14* (2006.01)
(Continued)

(52) U.S. Cl.
CPC .......... *H04B 1/403* (2013.01); *H03D 7/1466* (2013.01); *H03L 7/099* (2013.01); *H03M 1/66* (2013.01);
(Continued)

(58) Field of Classification Search
CPC ...... H04B 1/403; H03D 7/1466; H03L 7/099; H03L 7/06; H03M 1/66; H03F 2200/534;
(Continued)

(56) References Cited

U.S. PATENT DOCUMENTS 7,294,993 B2 11/2007 Clavette et al.
8,095,082 B2 1/2012 Deng et al.
(Continued)

OTHER PUBLICATIONS

Omid Esmaeeli et al., A Transformer-Based Technique to Improve Tuning Range and Phase Noise of a 20-28-GHz LC-VCO and a 51-62-GHz Self-Mixing LC-VCO, IEEE Transactions on Circuits and Systems I: Regular Papers, Jun. 2022, pp. 2351-2363, vol. 69, No. 6, IEEE, New York, New York, United States.
(Continued)

*Primary Examiner* — Khai M Nguyen
(74) *Attorney, Agent, or Firm* — Treyz Law Group; Jason Tsai

(57) ABSTRACT

An electronic device may include wireless circuitry having a mixer configured to receive an oscillating signal from oscillator circuitry. The oscillator circuitry can include a chain of buffer circuits referred to as oscillator driver circuitry. Transformers may be coupled at the input and output of each buffer circuit in the chain. Adjustable biasing circuits may be coupled at the input of a selected buffer circuit in the chain. The adjustable biasing circuits can be digital-to-analog converters (DACs) configured to apply a differential direct current (DC) offset voltage to the input of the selected buffer circuit. The differential DC offset voltage can have a value that minimizes a second harmonic component of the oscillator driver circuitry.

20 Claims, 9 Drawing Sheets

(51) Int. Cl.
    *H03L 7/06*           (2006.01)
    *H03L 7/099*        (2006.01)
    *H03M 1/66*         (2006.01)

(52) U.S. Cl.
    CPC .. *H03F 2200/534* (2013.01); *H03F 2200/537*
          (2013.01); *H03F 2200/541* (2013.01); *H03F*
          *2203/45018* (2013.01); *H03F 2203/45318*
          (2013.01); *H03L 7/06* (2013.01)

(58) Field of Classification Search
    CPC ......... H03F 2200/537; H03F 2200/541; H03F
          2203/45018; H03F 2203/45318; H03F
                          3/45183
    USPC ................................................. 341/126, 144
    See application file for complete search history.

(56)                 References Cited

U.S. PATENT DOCUMENTS

| | | | |
|---|---|---|---|
| 8,198,930 B2 * | 6/2012 | Zerbe ........................ | G06F 1/10 |
| | | | 327/158 |
| 9,893,728 B2 | 2/2018 | Song et al. | |
| 10,530,342 B2 * | 1/2020 | Panier ................. | H03K 5/1565 |
| 10,545,205 B2 | 1/2020 | Trakimas | |
| 11,431,358 B2 | 8/2022 | Park et al. | |

OTHER PUBLICATIONS

Kai Xu et al., A Single-Pin Antenna Interface RF Front End Using a Single-MOS DCO-PA and a Push-Pull LNA, IEEE Journal of Solid-State Circuits, Aug. 2020, pp. 2055-2068, vol. 55, No. 8, IEEE, New York, New York, United States.

* cited by examiner $f_{IF}$ $f_{B} = 2f_{LO} - f_{RFB}$ $f_{LO}$ $f_{RF}$ $f_{RFB}$ $2f_{LO}$ frequency

LOCAL OSCILLATOR DRIVER CIRCUITRY WITH SECOND HARMONIC REJECTION

This application is a continuation of U.S. patent application Ser. No. 17/877,503, filed Jul. 29, 2022, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas that are used to transmit radio-frequency signals and receive radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory mixers and local oscillator circuitry for an electronic device.

SUMMARY

An electronic device may include wireless circuitry. The wireless circuitry may include one or more mixers that receive an oscillating signal. An oscillator can generate the oscillating signal, and oscillator driver circuitry can be used to convey the oscillating signal to the one or more mixers.

An aspect of the disclosure provides oscillator driver circuitry that includes a first buffer circuit configured to receive an oscillating signal, a second buffer circuit configured to receive the oscillating signal from the first buffer circuit and configured to output the oscillating signal to a radio-frequency mixer, a first bias adjustment circuit coupled to a first input terminal of the second buffer and configured to apply a first direct current (DC) offset voltage to the first input of the second buffer, and a second bias adjustment circuit coupled to a second input terminal of the second buffer and configured to apply a second direct current (DC) offset voltage to the second input of the second buffer. The first and second bias adjustment circuits can be digital-to-analog converters. The first DC offset voltage can have a first magnitude and a first polarity, whereas the second DC offset voltage can have a second magnitude equal to the first magnitude and a second polarity opposite the first polarity.

At least the second buffer circuit can include: a first input transistor having a gate terminal coupled to the first input terminal and having a source-drain terminal coupled to a first output terminal of the second buffer circuit; a second input transistor having a gate terminal coupled to the second input terminal and having a source-drain terminal coupled to a second output terminal of the second buffer circuit; a tail transistor having a first source-drain terminal coupled to the first and second input transistors, a second source-drain terminal coupled to a power supply line, and a gate terminal configured to receive a bias voltage; a first capacitance neutralization transistor having a gate terminal coupled to the gate terminal of the first input transistor, a first source-drain terminal coupled to the second output terminal, and a second source-drain terminal coupled to a power supply terminal via a first resistor; and a second capacitance neutralization transistor having a gate terminal coupled to the gate terminal of the second input transistor, a first source-drain terminal coupled to the first output terminal, and a second source-drain terminal coupled to the power supply terminal via a second resistor.

The oscillator driver circuitry can further include a first transformer coupled at an input of the first buffer circuit, a second transformer coupled between the first and second buffer circuits, and a third transformer coupled at an output of the second buffer circuit. The oscillator driver circuitry can further include a third buffer circuit configured to receive the oscillating signal from the second buffer circuit and configured to output the oscillating signal to the radio-frequency mixer.

An aspect of the disclosure provides a buffer circuit that includes a first input transistor having a gate terminal configured to receive an oscillating signal and having a source-drain terminal coupled to a first output terminal of the buffer circuit, a second input transistor having a gate terminal configured to receive the oscillating signal and having a source-drain terminal coupled to a second output terminal of the buffer circuit, a first biasing circuit coupled to the gate terminal of the first input transistor and configured to apply a first offset voltage on the gate terminal of the first input transistor, and a second biasing circuit coupled to the gate terminal of the second input transistor and configured to apply a second offset voltage on the gate terminal of the second input transistor. The first offset voltage can have a positive direct current (DC) value, whereas the second offset voltage can have a negative direct current (DC) value. The first biasing circuit and the second biasing circuit can be digital-to-analog converters with tunable resistances.

An aspect of the disclosure provides wireless circuitry that includes a radio-frequency mixer and oscillator circuitry coupled to an input of the radio-frequency mixer. The oscillator circuitry can include a phase-locked loop configured to generate an oscillating signal, a chain of buffer circuits configured to convey the oscillating signal output from the phase-locked loop to the input of the radio-frequency mixer, and one or more biasing circuits configure to apply a direct current (DC) offset voltage to at least one buffer circuit in the chain of buffer circuits. The one or more biasing circuits can be disposed at an input of a last buffer circuit in the chain of buffer circuits. The one or more biasing circuits can include one or more resistive digital-to-analog converters.

DETAILED DESCRIPTION

Figure 1:
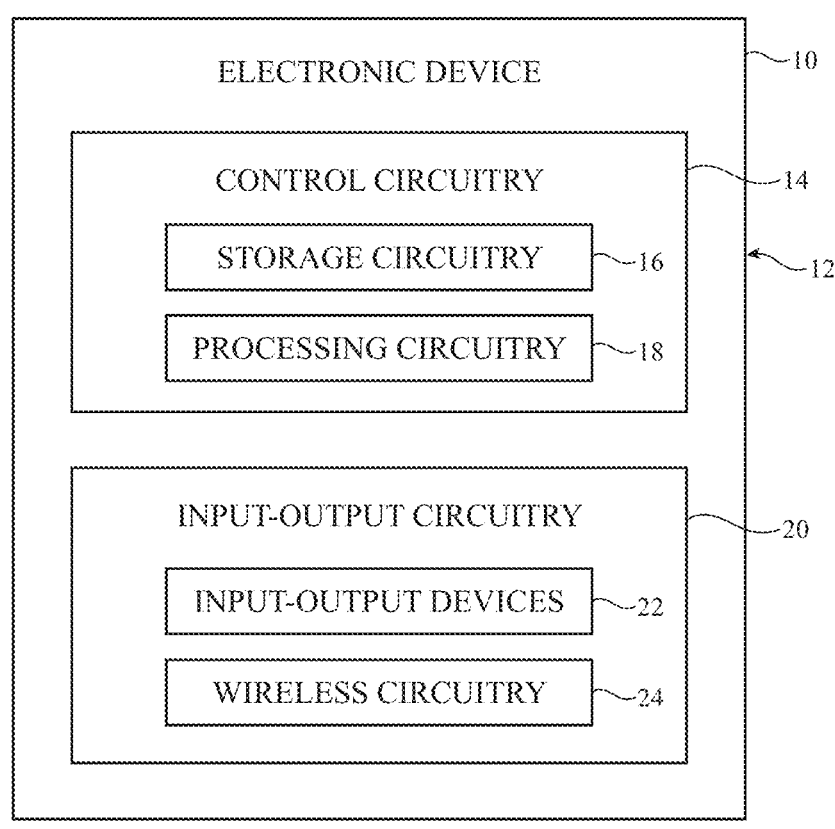
FIG. 1 is a diagram of an illustrative electronic device having wireless circuitry in accordance with some embodiments.

An electronic device such as electronic device 10 of FIG. 1 may be provided with wireless circuitry. The wireless circuitry may include one or more mixers such as a mixer in the transmit path for upconverting (modulating) signals from lower frequencies to higher frequencies and such as a mixer in the receive path for downconverting (demodulating) signals from higher frequencies to lower frequencies. A mixer can receive an oscillating (clock) signal from local oscillator circuitry. The local oscillator (LO) circuitry can exhibit non-linearities that produce a second harmonic component. The second harmonic component of the LO circuitry can mix with other input signals of the mixer to interfere with in-band signals of interest at the output of the mixer. This effect is sometimes referred to collectively as the second harmonic conversion gain of the mixer.

The local oscillator (LO) circuitry may include a chain of buffer stages. Transformers can be coupled at the input and output of each buffer stage in the chain. Bias adjustment circuits can be disposed at the input of at least one of the buffer stages to introduce a differential DC offset voltage. The amount of differential DC offset voltage can be tuned to minimize the differential mode second harmonic output component of the LO circuitry. As an example, the bias adjustment circuits can be formed at the input of the last buffer stage in the chain. As another example, the bias adjustment circuits can be formed at the input of the first buffer stage in the chain. As another example, the bias adjustment circuits can be formed at the input of an intermediate buffer stage in the chain. As another example, the bias adjustment circuits can be formed after the last buffer stage in the chain directly at the input of the mixer. Configured and operated in this way, the second harmonic conversion gain of the mixer can be reduced, which suppresses undesired in-band spurs.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
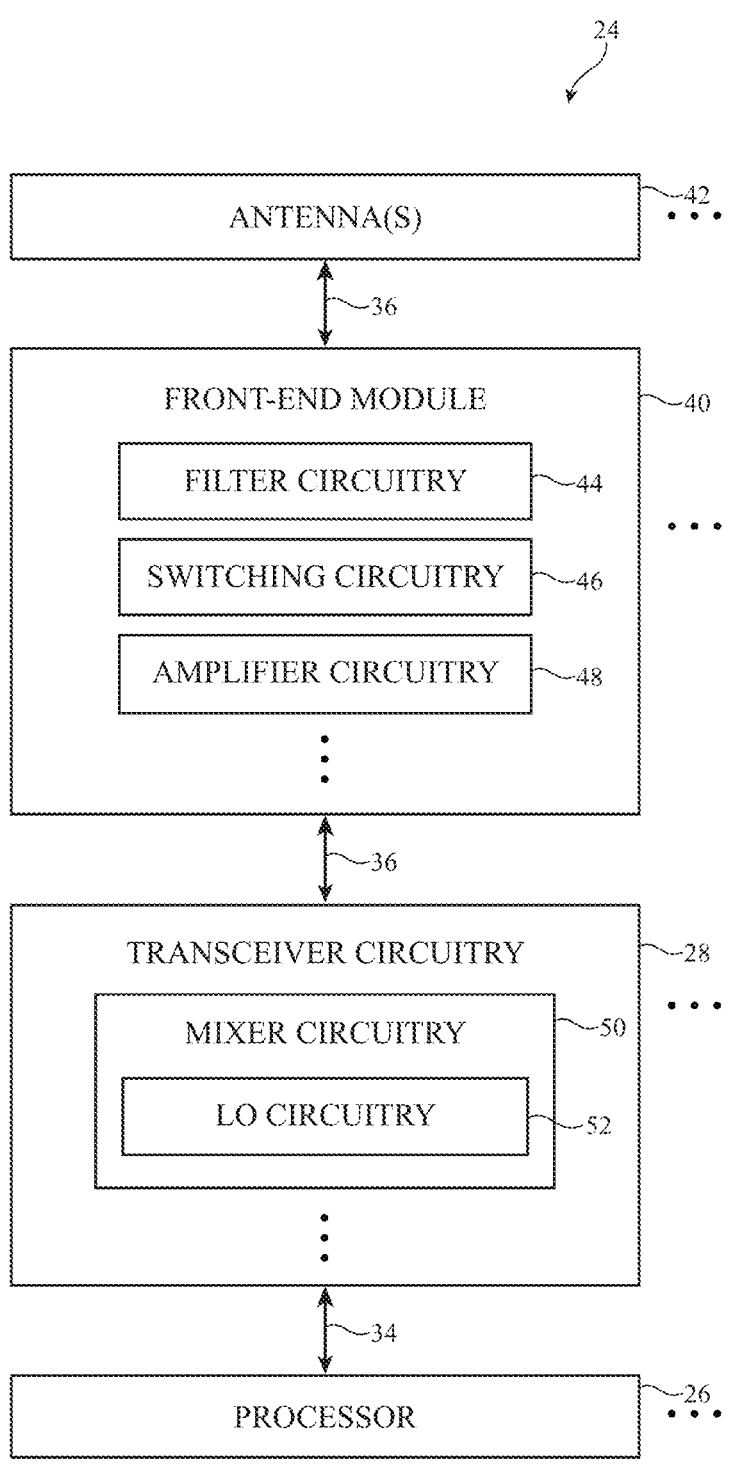
FIG. 2 is a diagram of illustrative wireless circuitry having transceiver circuitry in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLO-NASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for upconverting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34. Mixer circuitry 50 can include local oscillator circuitry such as local oscillator (LO) circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies.

Figures 3A, 3B:
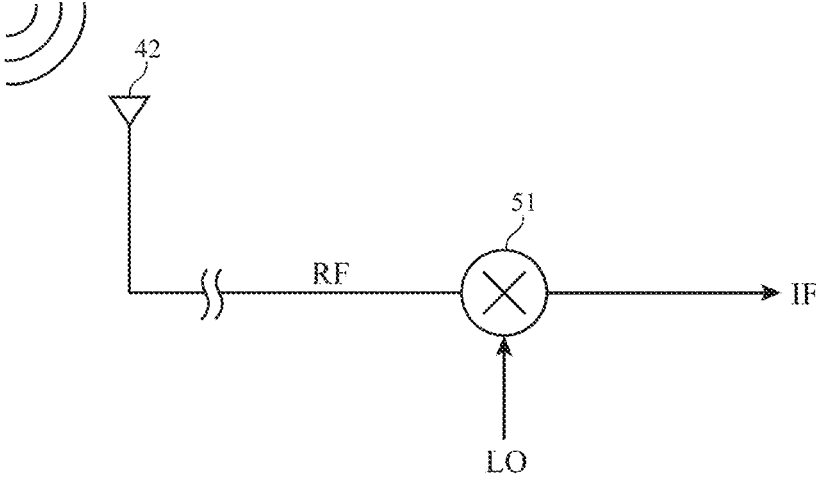
FIG. 3A is a diagram of an illustrative mixer in a receive path in accordance with some embodiments.
FIG. 3B is a diagram illustrating how a radio-frequency blocker can downconvert to an intermediate frequency of interest through the second harmonic conversion gain of a receiving mixer in accordance with some embodiments.

FIG. 3A is a diagram of an illustrative mixer in a receive (RX) path of the wireless circuitry. As shown in FIG. 3A, antenna 42 may feed received radio-frequency signals to mixer 51. Mixer 51 in the receive (downlink) path may be referred to as a receiving mixer. Mixer 51 may represent one or more receiving mixers in mixer circuitry 50 shown in FIG. 2. Mixer 51 may have a first input configured to receive a radio-frequency signal from antenna 42, a second input configured to receive an oscillating signal LO, and an output on which a demodulated signal that is downconverted to an intermediate frequency (IF) range is generated (as an example). One or more components such as a radio-frequency coupler, filter circuitry, antenna tuning element(s), matching network(s), switching circuitry, amplifier circuitry, other radio-frequency front end components, other transceiver components, and/or other wireless components can be disposed in the receive path between antenna 42 and mixer 51. Receiving mixer 51 that receives a radio-frequency signal can be referred to as a radio-frequency mixer.

FIG. 3B is a diagram illustrating how a second harmonic conversion gain of mixer 51 can generate undesired in-band emissions at the mixer output if care is not taken. As shown in FIG. 3B, the radio-frequency signal received at the first input of mixer 51 can be located at frequency $f_{RF}$; adjacent channels or an in-band blocker can be located at $f_{RFB}$; the LO signal received at the second input of mixer 51 can be located at frequency $f_{LO}$; and the demodulated signal generated at the output of mixer 51 can be located at intermediate frequency $f_{IF}$. In practice, the local oscillator circuitry feeding the second input of mixer 51 can exhibit non-linear behavior that results in generation of a second harmonic component at frequency $2*f_{LO}$. Such second harmonic component can mix with the RF signal of an adjacent channel or an in-band blocker at $f_{RFB}$ and generate a downconverted blocker signal at frequency $f_B$, where blocker frequency $f_B$ is equal to $2*f_{LO}$ minus $f_{RFB}$ (see, e.g., arrows 60). This phenomenon is sometimes referred to as being caused by the second harmonic conversion gain of mixer 51.

The placement of the blocker frequency $f_B$ can be problematic if the selection of the radio-frequency $f_{RF}$ and the local oscillator frequency $f_{LO}$ results in a corresponding $f_B$ that is within or close to the intermediate frequency (IF) range of interest. For example, consider a scenario in which frequency $f_{RF}$ is equal to 37 GHz, frequency $f_{RFB}$ is equal to 38 GHz, and frequency $f_{LO}$ is equal to 25 GHz. The intermediate frequency $f_{IF}$ will be equal to 12 GHz (e.g., $f_{RF}-f_{LO}=37-25=12$ GHz). In this example, the downconverted blocker frequency $f_B$ will also be equal to 12 GHz (e.g., $2*f_{LO}-f_{RFB}=2*25-38=12$ GHz). In other words, the blocker signal at $f_B$ can interfere with the downconverted signal of interest at intermediate frequency $f_{IF}$ at the output of mixer 51, which can cause self-desense and degrade the overall signal-to-noise ratio of the receive path.

Figure 4A:
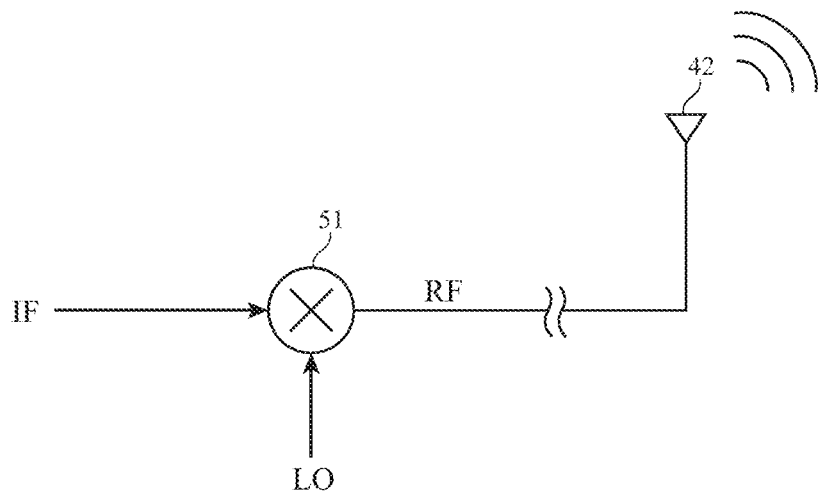
FIG. 4A is a diagram of an illustrative mixer in a transmit path in accordance with some embodiments.

FIG. 4A is a diagram of an illustrative mixer in a transmit (TX) path of the wireless circuitry. As shown in FIG. 4A, mixer 51 may output radio-frequency signals that are ultimately radiated by antenna 42. Mixer 51 in the transmit (uplink) path may be referred to as a transmitting mixer. Mixer 51 may represent one or more transmitting mixers in mixer circuitry 50 shown in FIG. 2. Transmitting mixer 51 may have a first input configured to receive a signal in the intermediate frequency (IF) range, a second input configured to receive an oscillating signal LO, and an output on which a modulated signal that is upconverted to a radio frequency (RF) range is generated (as an example). One or more components such as a radio-frequency coupler, filter circuitry, antenna tuning element(s), matching network(s), switching circuitry, amplifier circuitry, other radio-frequency front end components, other transceiver components, and/or other wireless components can be disposed in the transmit path between transmitting mixer 51 and antenna 42. Transmitting mixer 51 that outputs a radio-frequency signal can be referred to as a radio-frequency mixer.

Figure 4B:
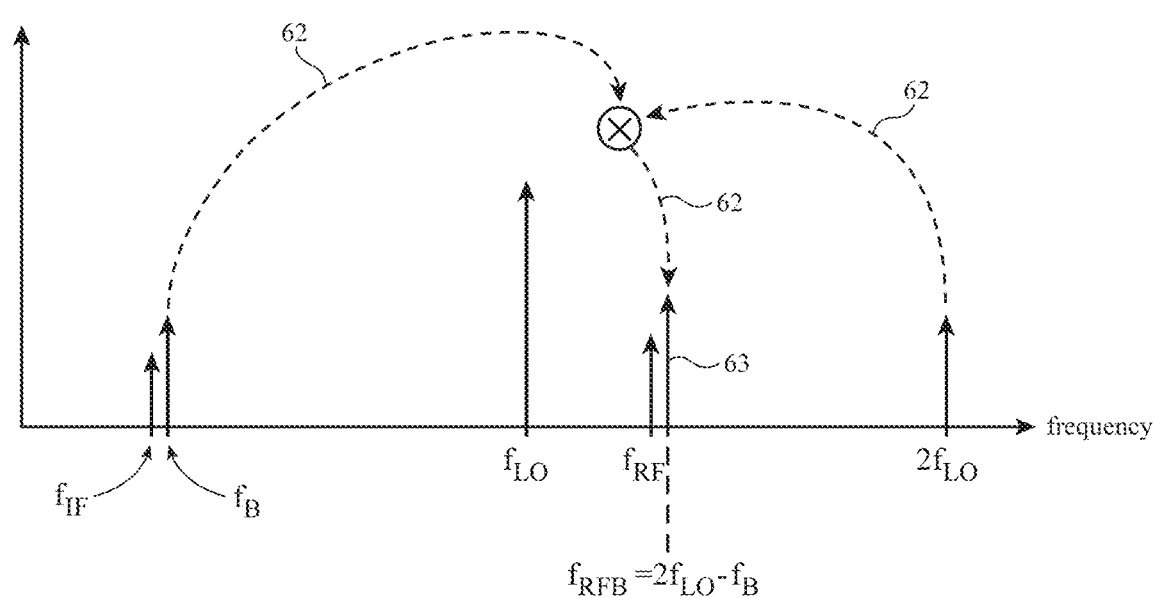
FIG. 4B is a diagram illustrating how a blocker signal in an intermediate frequency can upconvert to a radio-frequency range of interest through the second harmonic conversion gain of a transmitting mixer caused by a second harmonic component of local oscillator circuitry feeding the transmitting mixer in accordance with some embodiments.

FIG. 4B is a diagram illustrating how a second harmonic conversion gain of a transmitting mixer 51 can generate undesired in-band emissions at the mixer output if care is not taken. As shown in FIG. 4B, the intermediate frequency signal received at the first input of mixer 51 can be located at frequency $f_{IF}$; the LO signal received at the second input of mixer 51 can be located at frequency $f_{LO}$; and the modulated signal generated at the output of mixer 51 can be located at radio frequency $f_{RF}$. In practice, the local oscillator circuitry feeding the second input of transmitting mixer 51 can exhibit non-linear behavior that results in generation of a second harmonic component at frequency $2*f_{LO}$. Such second harmonic component can mix with an adjacent channel signal or in-band intermediate frequency blocker at $f_B$ and generate an upconverted interfering signal 63 that can fall in the radio-frequency range of interest (see, e.g., arrows 62 landing at frequency $f_{RFB}$, where $f_{RFB}$ is equal to $2*f_{LO}$ minus $f_B$). This phenomenon is sometimes referred to as being caused by the second harmonic conversion gain of mixer 51.

The frequency $f_{RFB}$ of the interfering signal 63 can be problematic if the selection of the radio-frequency $f_{RF}$ and the local oscillator frequency $f_{LO}$ results in the interfering signal falling within or close to the radio-frequency (RF) range of interest. For example, consider the scenario above in which frequency $f_{RF}$ is equal to 37 GHz and frequency $f_{LO}$ is equal to 25 GHz. The intermediate frequency $f_{IF}$ will be equal to 12 GHz (e.g., $f_{RF}-f_{LO}=37-25=12$ GHz). In this example, an in-band blocker at frequency $f_B$ equal to 13 GHz can also mix with $2*f_{LO}$ to recreate an upconverted interference signal 63 at frequency $f_{RFB}$ also at 37 GHz (e.g., $2*f_{LO}-f_B=2*25-13=37$ GHz). In other words, signal 63 can interfere with the radio-frequency signal of interest at $f_{RF}$ at the output of transmitting mixer 51, which can cause the transmit path to violate performance criteria.

Figure 5:
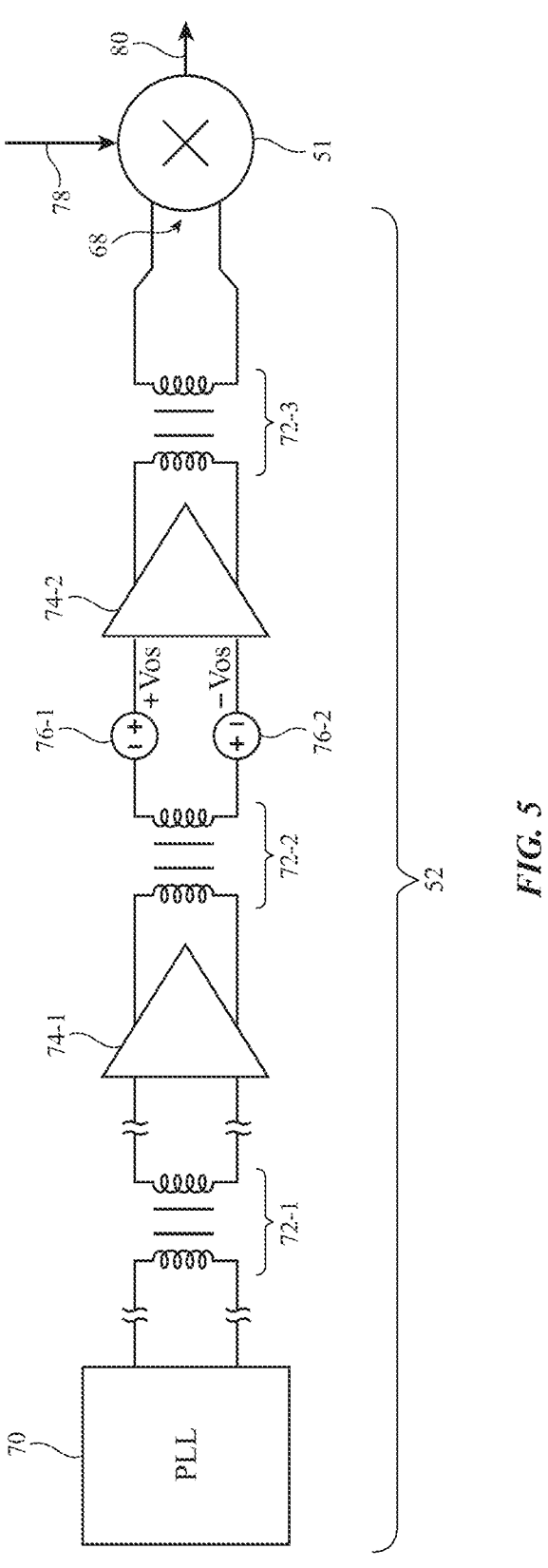
FIG. 5 is a diagram of illustrative local oscillator circuitry having bias adjustment circuits coupled at inputs of a last buffer stage in accordance with some embodiments.

In accordance with some embodiments, mixer 51 may be coupled to local oscillator circuitry 52 that includes circuits for minimizing or reducing the second harmonic component associated with circuitry 52, which can help improve the performance of the transmit path and the receive path. FIG. 5 is a diagram of such local oscillator circuitry 52. As shown in FIG. 5, local oscillator circuitry 52 may include a phase-locked loop such as phase-lock loop (PLL) 70 having an output port that is coupled to a buffer chain. Phase-locked loop 70 may be configured to generate one or more oscillating (clock) signals with different phases. This example in which LO circuitry 52 has a phase-locked loop 70 for generating oscillator signals is illustrative. In general, LO circuitry 52 can include other types of on-chip clock signal generators, crystal oscillators, harmonic oscillators, LC oscillators, RC oscillators, negative-resistance oscillators, relaxation oscillators, ring oscillators, delay-line oscillators, voltage-controlled oscillators, acoustic resonators, and/or other types of circuits configured to generate oscillating signals.

A chain of buffers can be coupled between the PLL output port and an LO input port 68 of mixer 51. The chain of buffers conveying oscillating signals from the PLL to the mixer is sometimes referred to as local oscillator driver circuitry. The PLL 70 can sometimes be considered to be part of the oscillator driver circuitry. Mixer 51 can have another input port 78 configured to receive a radio-frequency signal in the receive scenario or to receive an IF signal in the transmit scenario. Mixer 51 can have an output port 80 on which a corresponding demodulated (downconverted) signal is generated in the RX scenario or a corresponding modulated (upconverted) signal is generated in the TX scenario. In the example of FIG. 5, LO circuitry 52 includes two buffer stages. The first buffer stage includes a first buffer 74-1, and the second buffer stage includes a second buffer 74-2. Buffers 74-1 and 74-2 are sometimes referred to as LO driver circuits. The first buffer stage may be coupled to the PLL output port via a first transformer 72-1. The first transformer 72-1 has a primary coil (winding) coupled to the PLL input port and has a secondary coil (winding) coupled to the input of first buffer 74-1 in the first buffer stage.

The first buffer stage may be coupled to the second buffer stage via a second transformer 72-2. The second transformer 72-2 has a primary coil (winding) coupled to an output of first buffer 74-1 and has a secondary coil (winding) coupled to the input of second buffer 74-2 in the second buffer stage. The second buffer stage may be coupled to LO input port 68 of mixer 51 via a third transformer 72-3. The third transformer 72-3 has a primary coil (winding) coupled to an output of second buffer 74-2 and has a secondary coil (winding) coupled to the mixer LO input port 68. In other words, transformers may be coupled at the input and output of each buffer stage. The transformers in the LO chain are optional and can be omitted in certain embodiments.

The buffers can be implemented as differential circuits (e.g., a driver with a differential input port and a differential output port). In accordance with an embodiment, bias adjustment circuits such as bias adjustment circuits 76-1 and 76-2 can be coupled at the differential input port of at least one of the buffer stages to tune the second harmonic component of the LO buffer chain. In the example of FIG. 5, first bias adjustment circuit 76-1 is coupled at a first (e.g., positive) input terminal of the second (last) buffer 74-2 in the LO buffer chain, whereas second bias adjustment circuit 76-2 is coupled at a second (e.g., negative) input terminal of the last buffer 74-2 in the LO buffer chain. The first and second input terminals of buffer 74-2 form the differential input port of buffer 74-2.

Bias adjustment circuits 76-1 and 76-2 may be configured to introduce a systematic DC voltage offset at the differential input port of the last buffer 74-2. For example, bias adjustment circuit 76-1 may be configured to apply a positive DC offset voltage +Vos at the first input terminal of buffer 74-2, whereas bias adjustment circuit 76-2 may be configured to apply a negative DC offset voltage −Vos at the second input terminal of buffer 74-2. This example in which +Vos and −Vos are respectively applied to the positive and negative input terminals of buffer 74-2 is illustrative. In other embodiments, circuit 76-1 might be configured to inject −Vos at the first (positive) input terminal of buffer 74-2 while circuit 76-2 is configured to inject +Vos at the second (negative) input terminal of buffer 74-2.

Figure 7:
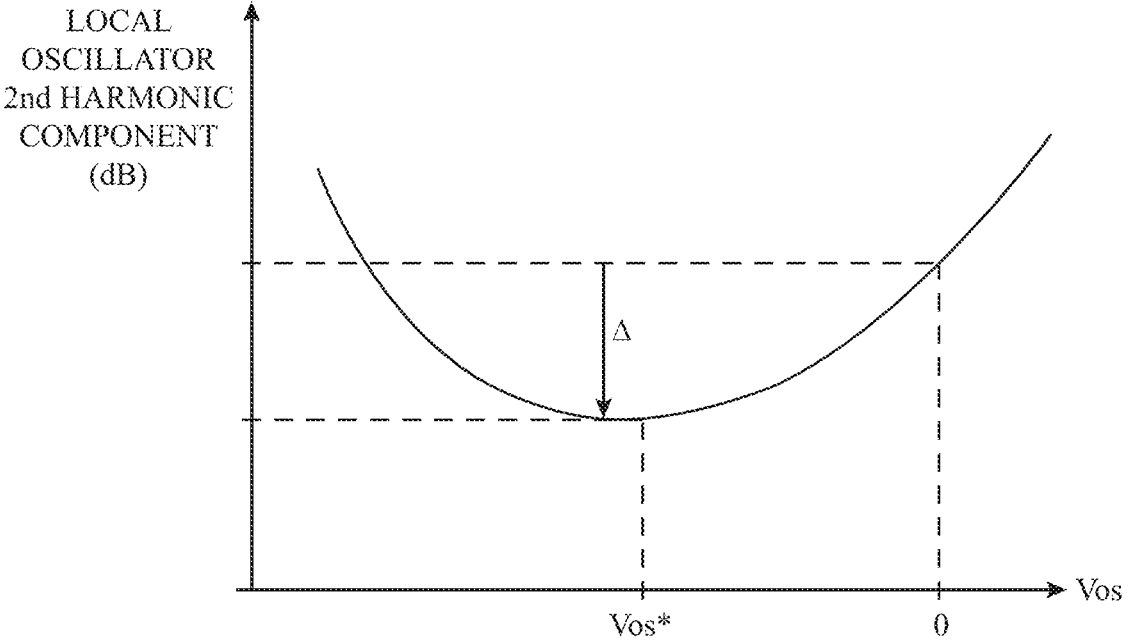
FIG. 7 is a diagram plotting the magnitude of a local oscillator differential mode $2^{nd}$ harmonic component as a function of a DC offset voltage provided by a bias adjustment circuit of the type shown in FIGS. 5-6 in accordance with some embodiments.

The amount of +Vos/−Vos can be selected to minimize the $2^{nd}$ harmonic frequency component of the LO chain. FIG. 7 is a diagram plotting the magnitude of the $2^{nd}$ harmonic component produced by LO circuitry 52 as a function of DC offset voltage Vos provided by a bias adjustment circuit such as circuit 76-1 or 76-2. As shown in FIG. 7, the DC offset voltage has a level Vos* that minimizes the $2^{nd}$ harmonic component of the LO circuitry. Bias adjustment circuits 76-1 and 76-2 can be statically set to this optimal Vos* level or can be dynamically adjusted if this optimal Vos point varies during the operation of the wireless circuitry. The +Vos applied to input terminal inp and the −Vos applied to input terminal inn can be equal in magnitude but opposite in polarity (as an example). As another example, bias circuits 76-1 and 76-2 can be configured to apply an asymmetric biasing scheme where +Vos1 that is applied to input terminal inp and −Vos2 that is applied to input terminal inn has different polarities and differing magnitudes.

This technique in which the bias adjustment circuits introduce a DC voltage offset at the differential input port of one of the buffer stages to lower the $2^{nd}$ harmonic component of the LO chain is sometimes referred to herein as a differential trimming scheme, a DC trimming scheme, or a differential mode DC trimming scheme. This differential DC trimming scheme can reduce the differential mode second harmonic voltage of the LO signal propagating through the LO buffer chain (i.e., the oscillator signal output from the PLL can be passed through the chain of buffer circuits in the LO buffer chain). Reducing the second harmonic LO component in this way can help suppress the blocker signal at frequency $f_B$ in the reception scenario described in connection with FIG. 3B and can help suppress the interference signal 63 at frequency $f_{RFB}$ in the transmission scenario described in connection with FIG. 4B.

Figure 6:
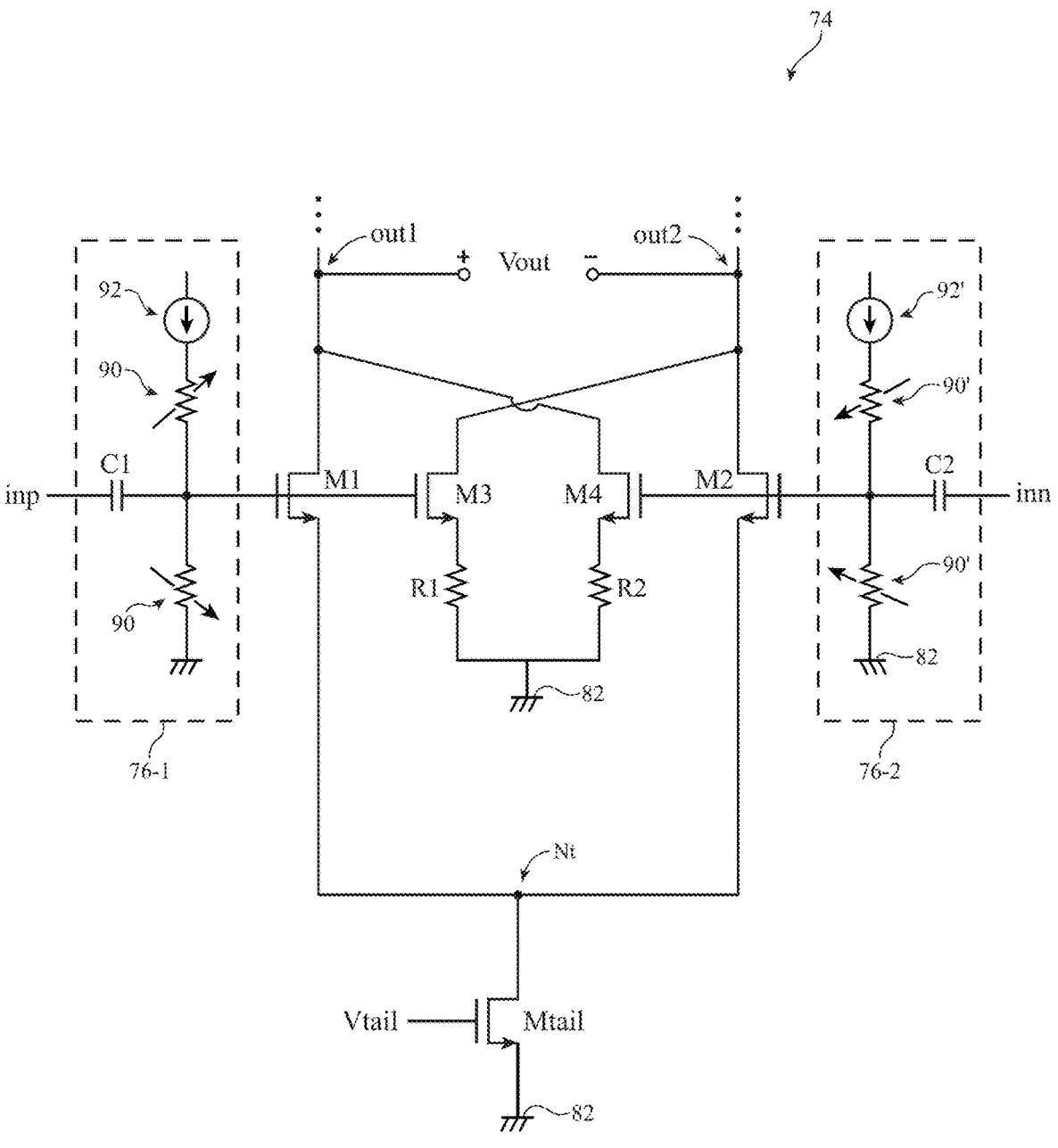
FIG. 6 is a circuit diagram of an illustrative local oscillator buffer stage having bias adjustment circuits coupled to its inputs in accordance with some embodiments.

FIG. 6 is a circuit diagram showing an exemplary implementation of a local oscillator (LO) buffer 74. As shown in FIG. 6, buffer 74 may include transistors M1, M2, M3, M4, and Mtail, and resistors R1 and R2. Transistors M1-M4 and Mtail may be n-type (n-channel) transistors such as n-type metal-oxide-semiconductor (NMOS) devices. The tail transistor Mtail may have a source terminal coupled to a ground power supply line 82 (e.g., a ground ine on which a ground power supply voltage Vss is provided), a drain terminal coupled to a tail node Nt, and a gate terminal configured to receive bias voltage Vtail.

Transistor M1 may have a source terminal coupled to tail node Nt, a drain terminal coupled to a first buffer output terminal out1, and a gate terminal coupled to a positive input terminal inp. Transistor M2 may have a source terminal coupled to tail node Nt, a drain terminal coupled to a second buffer output terminal out2, and a gate terminal coupled to a negative input terminal inn. Input terminals inp and inn serve collectively as the differential input port of buffer 74. Transistors M1 and M2 are therefore sometimes referred to or defined as input transistors. The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa).

Transistor M3 may have a source terminal coupled to ground power supply line 82 via resistor R1, a gate terminal coupled to positive input terminal inp, and a drain terminal cross-coupled to the drain terminal of input transistor M2. Transistor M4 may have a source terminal coupled to ground power supply line 82 via resistor R2, a gate terminal coupled to negative input terminal inn, and a drain terminal cross-coupled to the drain terminal of input transistor M1. Configured in this way, cross-coupled transistors M3 and M4 can be used to neutralize the gate-to-drain parasitic capacitance of input transistors M1 and M2 and are therefore sometimes referred to as parasitic capacitance neutralization transistors. The use of parasitic capacitance neutralization transistors M3 and M4 (and the corresponding resistors R1 and R2) are optional.

If desired, additional cascode transistors (not shown) can optionally be coupled between the input transistors and the buffer output terminals out1 and out2. The buffer output terminals out1 and out2 serve collectively as the differential output port of buffer 74. In general, load components such as one or more inductors, one or more capacitors, and/or other passive or active components can be coupled to the output port of buffer 74.

Bias adjustment circuit 76-1 can be coupled at the first input terminal of buffer 74, whereas bias adjustment circuit 76-2 can be coupled at the second input terminal of buffer 74. In the example of FIG. 6, bias adjustment circuits 76-1 and 76-2 are implemented as DC bias digital-to-analog converters (DACs). For example, circuit 76-1 can be implemented as a first DC bias DAC that includes capacitor C1, tunable resistances 90, and a current source 92. A first tunable resistance 90 can be coupled between the gate terminal of input transistor M1 and the ground line. A second tunable resistance 90 can be coupled between the gate terminal of input transistor M1 and current source 92. Capacitor C1 may have a first terminal coupled to buffer input terminal inp and a second terminal coupled to the gate terminal of input transistor M1. Configured in this way, the first and second tunable resistances 90 (sometimes referred to collectively as a first resistive divider) can be adjusted to apply the desired amount of DC offset voltage to the positive input terminal inp of buffer 74. The first and second tunable resistances 90 are sometimes referred to as adjustable resistors.

Similarly, bias adjustment circuit 76-2 can be implemented as a second DC bias DAC that includes capacitor C2, its own set of tunable resistances 90', and its own current source 92'. A first tunable resistance 90' can be coupled between the gate terminal of input transistor M2 and the ground line. A second tunable resistance 90' can be coupled between the gate terminal of input transistor M2 and current source 92'. Capacitor C2 may have a first terminal coupled to buffer input terminal inn and a second terminal coupled to the gate terminal of input transistor M2. Configured in this way, the first and second tunable resistances 90' (sometimes referred to collectively as a second resistive divider) can be adjusted to apply the desired amount of DC offset voltage to the negative input terminal inn of buffer 74. The first and second tunable resistances 90' are sometimes referred to as adjustable resistors. The example of FIG. 6 in which bias adjustment circuits 76-1 and 76-2 are implemented as resistive DACs is illustrative. In general, other types of circuits for introducing, injecting, presenting, establishing, or otherwise applying a DC bias voltage at the input terminals of buffer 74 can be used.

The embodiment of FIG. 5 in which the DC bias adjustment circuits 76-1 and 76-2 are disposed at the different input port of the last buffer stage is illustrative and is not intended to limit the scope of the present embodiments. The last buffer stage is sometimes referred or defined as the "final" buffer circuit or the "trailing" buffer circuit in the chain of buffers within circuitry 52. Forming the bias adjustment circuits 76-1 and 76-2 can be beneficial and technically advantageous since the trimming effect is close enough to the LO input port of the mixer but is not actually at the LO input port, which can be a sensitive node for tuning purposes. Configured as such, the LO feedthrough at the mixer output is not affected by the DC trimming operations that is performed at the buffer input side, thereby allowing an orthogonal bias voltage tuning.

Figure 8:
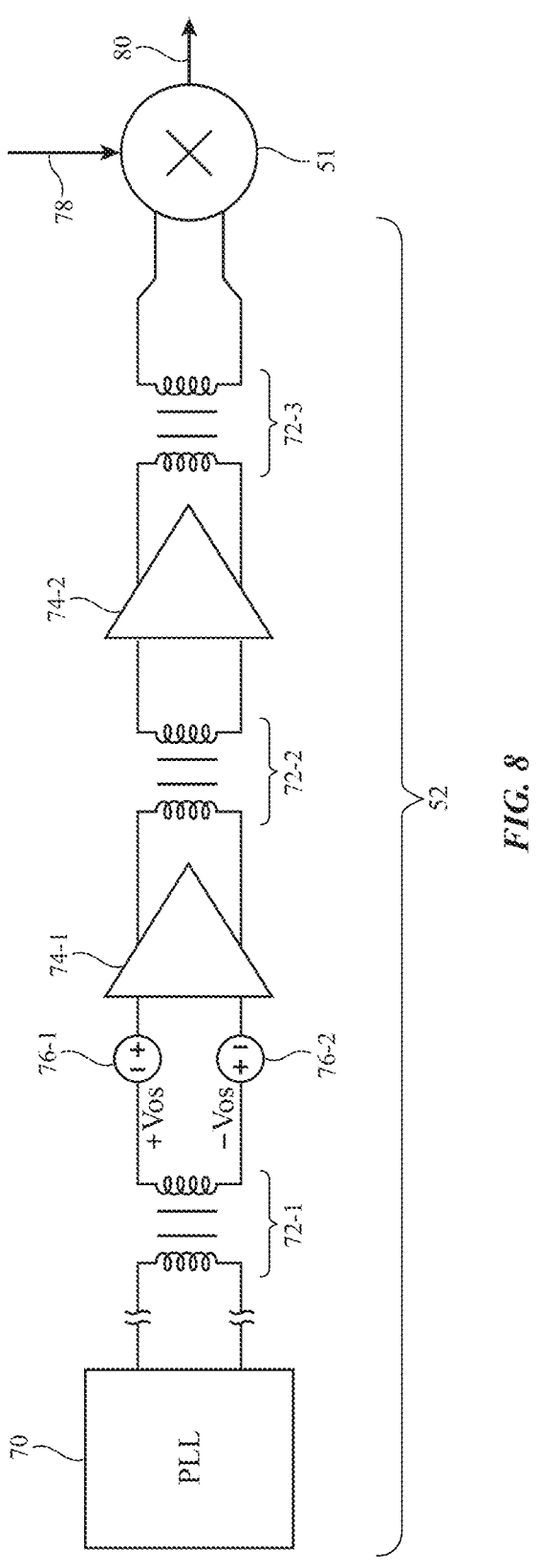
FIG. 8 is a diagram of illustrative local oscillator circuitry having bias adjustment circuits coupled at inputs of a first buffer stage in accordance with some embodiments.

FIG. 8 shows another embodiment in which DC bias adjustment circuits 76-1 and 76-2 are disposed at the differential input port of the first buffer stage in the LO chain. As shown in FIG. 8, first bias adjustment circuit 76-1 is coupled at a first (e.g., positive) input terminal of the first (leading) buffer 74-1 in the LO buffer chain, whereas second bias adjustment circuit 76-2 is coupled at a second (e.g., negative) input terminal of the leading buffer 74-1 in the LO buffer chain. The first and second input terminals of buffer 74-1 form the differential input port of buffer 74-1.

Bias adjustment circuits 76-1 and 76-2 may be configured to introduce a systematic DC voltage offset at the differential input port of the leading buffer 74-1. For example, bias adjustment circuit 76-1 may be configured to apply a positive DC offset voltage +Vos at the first input terminal of buffer 74-1, whereas bias adjustment circuit 76-2 may be configured to apply a negative DC offset voltage −Vos at the second input terminal of buffer 74-1. This example in which +Vos and −Vos are respectively applied to the positive and negative input terminals of buffer 74-1 is illustrative. In other embodiments, circuit 76-1 might be configured to inject −Vos at the first (positive) input terminal of buffer 74-1 while circuit 76-2 is configured to inject +Vos at the second (negative) input terminal of buffer 74-1. The amount of +Vos/−Vos can be selected to minimize the $2^{nd}$ harmonic frequency component of the LO chain. The +Vos applied to input terminal inp and the −Vos applied to input terminal inn can be equal in magnitude but opposite in polarity (as an example). As another example, bias circuits 76-1 and 76-2 can be configured to apply an asymmetric biasing scheme where +Vos1 that is applied to input terminal inp and −Vos2 that is applied to input terminal inn has different polarities and differing magnitudes.

In general, the LO buffer chain in circuitry 52 can include any number of buffer stages. For example, LO circuitry 52 may include at least two buffer stages, only one buffer stage, three or more buffer stages, four or more buffer stages, 2-10 buffer stages, or more than 10 buffer stages. Transformers 72 can optionally be formed at the input and/or output of each buffer stage in the LO chain. Bias adjustment circuits 76-1 and 76-2 (e.g., bias DAC circuits or other types of DC offset voltage biasing circuits) can be coupled to the differential input port of the last buffer stage in the LO chain, to the differential input port of the penultimate buffer stage in the LO chain (e.g., the second to the last buffer stage), to the differential input port of the first buffer stage in the LO chain, to the differential input port of the second buffer stage in the LO chain, or to the differential input port of any intermediate buffer stage in the LO chain (e.g., some buffer stage between the first and last buffer stages in the LO chain). If desired, bias adjustment circuits 76-1 and 76-2 can be formed at the differential input ports of two or more buffer stages in the LO chain. For example, the bias adjustment circuits can be formed at the inputs of both the last buffer stage and the penultimate buffer stage.

Figure 9:
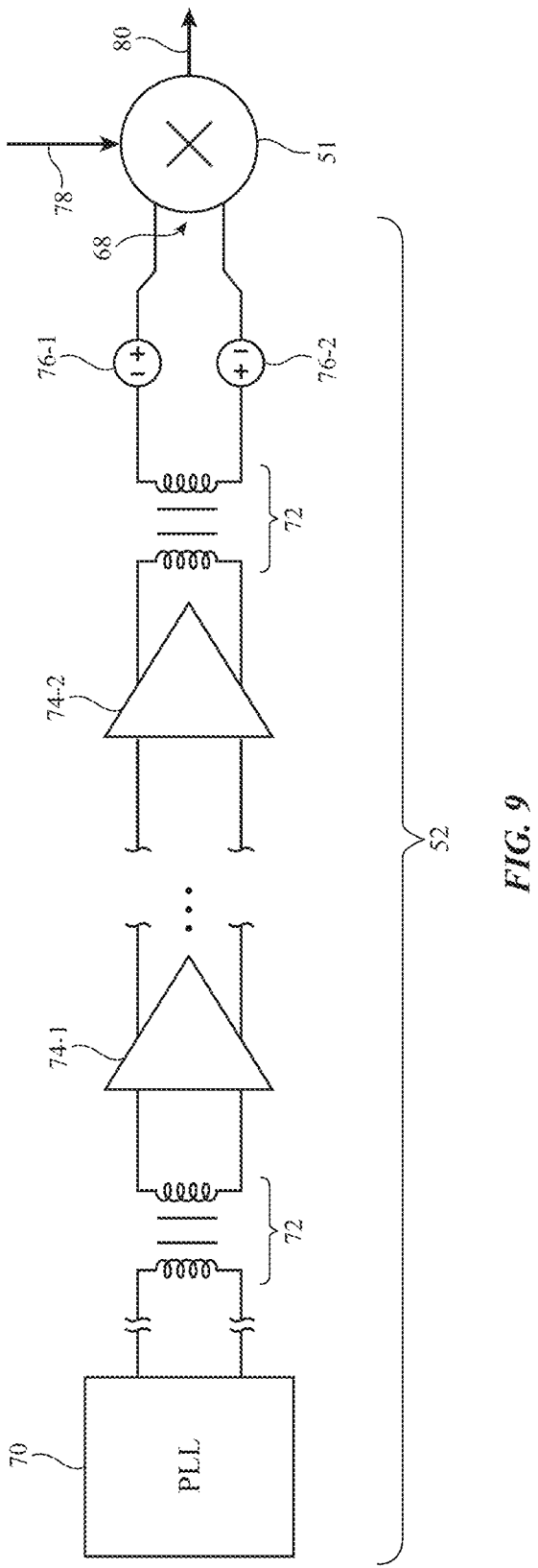
FIG. 9 is a diagram of illustrative local oscillator circuitry having bias adjustment circuits coupled at inputs of a mixer in accordance with some embodiments.

The embodiments of FIGS. 5 and 8 in which the bias adjustment (DC offset voltage trimming) circuits 76-1 and 76-2 are formed at the differential input port of one of the buffer stages is illustrative and is not intended to limit the scope of the present embodiments. FIG. 9 illustrates another embodiment in which bias adjustment circuits 76-1 and 76-2 are coupled directly at the LO input port of mixer 51. As shown in FIG. 9, bias adjustment circuits 76-1 and 76-2 are coupled between the differential output port of the last buffer stage and differential LO input port 68 of mixer 51.

Bias adjustment circuits 76-1 and 76-2 may be configured to introduce a systematic DC voltage offset at the differential LO input port 68 of mixer 51. Differential LO input port 68 may have two input terminals (e.g., a positive input terminal and a negative input terminal). For example, bias adjustment circuit 76-1 may be configured to apply a positive DC offset voltage +Vos at the first input terminal of LO input port 68, whereas bias adjustment circuit 76-2 may be configured to apply a negative DC offset voltage −Vos at the second input terminal of LO port 68. This example in which +Vos and −Vos are respectively applied to the positive and negative input terminals of LO input port 68 is illustrative. In other embodiments, circuit 76-1 might be configured to inject −Vos at the first (positive) input terminal of port 68 while circuit 76-2 is configured to inject +Vos at the second (negative) input terminal of port 68. The amount of +Vos/−Vos can be selected to minimize the differential mode $2^{nd}$ harmonic component of the LO chain. The +Vos and the −Vos can be equal in magnitude but opposite in polarity (as an example). As another example, bias circuits 76-1 and 76-2 can be configured to apply an asymmetric biasing scheme where +Vos1 that is applied to the positive terminal of port 68 and −Vos2 that is applied to negative terminal of port 68 has different polarities and differing magnitudes.

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Oscillator driver circuitry comprising:
a first buffer circuit configured to receive an oscillating signal;
a second buffer circuit having a first input configured to receive the oscillating signal from the first buffer circuit; and a first bias adjustment circuit coupled to the first input of the second buffer and configured to apply a first direct current (DC) offset voltage to the first input of the second buffer.

2. The oscillator driver circuitry of claim 1, further comprising:
a second bias adjustment circuit coupled to a second input of the second buffer and configured to apply a second direct current (DC) offset voltage to the second input of the second buffer.

3. The oscillator driver circuitry of claim 2, wherein the first bias adjustment circuit comprises a first digital-to-analog converter (DAC) and wherein the second bias adjustment circuit comprises a second digital-to-analog converter (DAC).

4. The oscillator driver circuitry of claim 3, wherein the second buffer circuit comprises:
a first input transistor having a gate terminal coupled to the first input and having a source-drain terminal coupled to a first output of the second buffer circuit; and
a second input transistor having a gate terminal coupled to the second input and having a source-drain terminal coupled to a second output of the second buffer circuit.

5. The oscillator driver circuitry of claim 4, wherein the second buffer circuit further comprises a tail transistor having a first source-drain terminal coupled to the first and second input transistors, a second source-drain terminal coupled to a power supply line, and a gate terminal configured to receive a bias voltage.

6. The oscillator driver circuitry of claim 4, wherein the second buffer circuit comprises:
a first capacitance neutralization transistor having a gate terminal coupled to the gate terminal of the first input transistor, a first source-drain terminal coupled to the second output, and a second source-drain terminal coupled to a power supply terminal via a first resistor; and
a second capacitance neutralization transistor having a gate terminal coupled to the gate terminal of the second input transistor, a first source-drain terminal coupled to the first output, and a second source-drain terminal coupled to the power supply terminal via a second resistor.

7. The oscillator driver circuitry of claim 4, wherein the first digital-to-analog converter comprises:
a first resistor having a first terminal coupled to the gate terminal of the first input transistor and having a second terminal coupled to a power supply line;
a second resistor having a first terminal coupled to the gate terminal of the first input transistor and having a second terminal coupled to a first current source; and
a first capacitor having a first terminal coupled to the gate terminal of the first input transistor and having a second terminal coupled to the first input of the second buffer circuit.

8. The oscillator driver circuitry of claim 7, wherein the second digital-to-analog converter comprises:
a third resistor having a first terminal coupled to the gate terminal of the second input transistor and having a second terminal coupled to the power supply line;
a fourth resistor having a first terminal coupled to the gate terminal of the second input transistor and having a second terminal coupled to a second current source; and a second capacitor having a first terminal coupled to the gate terminal of the second input transistor and having a second terminal coupled to the second input of the second buffer circuit.

9. The oscillator driver circuitry of claim 8, wherein the first, second, third, and fourth resistors comprise tunable resistances.

10. The oscillator driver circuitry of claim 2, wherein the first DC offset voltage has a first magnitude and a first polarity and wherein the second DC offset voltage has a second magnitude equal to the first magnitude and a second polarity opposite the first polarity.

11. The oscillator driver circuitry of claim 1, further comprising:
a first transformer coupled at an input of the first buffer circuit;
a second transformer coupled between the first and second buffer circuits; and
a third transformer coupled at an output of the second buffer circuit.

12. The oscillator driver circuitry of claim 1, further comprising:
a third buffer circuit configured to receive the oscillating signal from the second buffer circuit and configured to output the oscillating signal to a radio-frequency mixer.

13. A buffer circuit comprising:
a first input transistor having a gate terminal configured to receive an oscillating signal and having a source-drain terminal coupled to a first output of the buffer circuit;
a second input transistor having a gate terminal configured to receive the oscillating signal and having a source-drain terminal coupled to a second output of the buffer circuit; and
a first biasing circuit coupled to the gate terminal of the first input transistor and configured to apply a first offset voltage on the gate terminal of the first input transistor.

14. The buffer circuit of claim 13, further comprising:
a second biasing circuit coupled to the gate terminal of the second input transistor and configured to apply a second offset voltage on the gate terminal of the second input transistor.

15. The buffer circuit of claim 14, wherein the first offset voltage has a positive direct current (DC) value and wherein the second offset voltage has a negative direct current (DC) value.

16. The buffer circuit of claim 14, wherein the first biasing circuit and the second biasing circuit comprise digital-to-analog converters.

17. The buffer circuit of claim 14, wherein the first biasing circuit comprises:
a first tunable resistance having a first terminal coupled to the gate terminal of the first input transistor and having a second terminal coupled to a power supply line; and
a second tunable resistance having a first terminal coupled to the gate terminal of the first input transistor and having a second terminal coupled to a first current source.

18. The buffer circuit of claim 17, wherein the first biasing circuit further comprises:
a first capacitor having a first terminal coupled to the gate terminal of the first input transistor and having a second terminal configured to receive the oscillating signal.

19. The buffer circuit of claim 18, wherein the second biasing circuit comprises:
a third tunable resistance having a first terminal coupled to the gate terminal of the second input transistor and having a second terminal coupled to the power supply line;
a fourth tunable resistance having a first terminal coupled to the gate terminal of the second input transistor and having a second terminal coupled to a second current source; and
a second capacitor having a first terminal coupled to the gate terminal of the second input transistor and having a second terminal configured to receive the oscillating signal.

20. Circuitry comprising:
a chain of buffer circuits configured to propagate an oscillating signal, wherein the chain of buffer circuits includes at least a first buffer circuit and a second buffer circuit having an input configured to receive the oscillating signal from the first buffer circuit; and
one or more biasing circuits configured to apply an offset voltage to the input of the second buffer circuit in the chain of buffer circuits.

* * * * *